United States Patent
Lee et al.

(10) Patent No.: US 10,520,208 B2
(45) Date of Patent: Dec. 31, 2019

(54) DEHUMIDIFIER

(71) Applicant: LG Innotek Co., Ltd., Seoul (KR)

(72) Inventors: Jong Min Lee, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 95 days.

(21) Appl. No.: 15/562,708

(22) PCT Filed: Mar. 30, 2016

(86) PCT No.: PCT/KR2016/003247
§ 371 (c)(1),
(2) Date: Sep. 28, 2017

(87) PCT Pub. No.: WO2016/159649
PCT Pub. Date: Oct. 6, 2016

(65) Prior Publication Data
US 2018/0094823 A1    Apr. 5, 2018

(30) Foreign Application Priority Data

Mar. 31, 2015    (KR) .................. 10-2015-0045010

(51) Int. Cl.
*F24F 3/153*       (2006.01)
*H01L 35/30*       (2006.01)
(Continued)

(52) U.S. Cl.
CPC ............ *F24F 3/153* (2013.01); *F24F 3/1405* (2013.01); *F24F 5/0042* (2013.01); *F25B 21/02* (2013.01); *H01L 35/30* (2013.01)

(58) Field of Classification Search
CPC ......... F24F 5/0042; F25B 21/02; H01L 35/30
See application file for complete search history.

(56) References Cited

U.S. PATENT DOCUMENTS 4,180,985 A * 1/1980 Northrup, Jr. ......... B01D 53/26
                                                    62/271
4,324,052 A * 4/1982 Bosher .................... F26B 21/08
                                                    34/471
(Continued)

FOREIGN PATENT DOCUMENTS

CN    102692053 A    9/2012
CN    103620313 A    3/2014
(Continued)

OTHER PUBLICATIONS

International Search Report in International Application No. PCT/KR2016/003247, filed Mar. 30, 2016.
(Continued)

*Primary Examiner* — Henry T Crenshaw
(74) *Attorney, Agent, or Firm* — Saliwanchik, Lloyd & Eisenschenk

(57) ABSTRACT

Provided is a dehumidifier including: a dehumidification module including a compressor unit for compressing a refrigerant, a cooling unit for cooling air through the refrigerant, and a drying unit for drying air that passes through the cooling unit; and a thermoelectric module including a first substrate, a second substrate disposed to face the first substrate, a thermoelectric element disposed between the first substrate and the second substrate, a first heat conversion unit connected to the first substrate and disposed adjacent to the drying unit of the dehumidification module, and a second heat conversion unit connected to the second substrate and disposed adjacent to the cooling unit of the dehumidification module.

14 Claims, 12 Drawing Sheets

(51) Int. Cl.
*F25B 21/02* (2006.01)
*F24F 3/14* (2006.01)
*F24F 5/00* (2006.01)

(56) References Cited

U.S. PATENT DOCUMENTS

| | | | | |
|---|---|---|---|---|
| 6,134,895 A | * | 10/2000 | Poloskey | B60H 1/00849 165/249 |
| 2006/0144073 A1 | * | 7/2006 | Lee | F25B 21/02 62/333 |
| 2007/0101737 A1 | * | 5/2007 | Akei | F25B 1/00 62/238.6 |
| 2008/0216502 A1 | * | 9/2008 | Nakamura | B60H 1/00507 62/244 |
| 2011/0041539 A1 | * | 2/2011 | Nylykke | F25D 17/042 62/276 |
| 2013/0192272 A1 | * | 8/2013 | Ranalli | F25B 21/04 62/3.3 |
| 2014/0250930 A1 | * | 9/2014 | Unezaki | B01D 53/261 62/151 |
| 2016/0018152 A1 | * | 1/2016 | Ito | F24F 3/14 62/177 |
| 2016/0290684 A1 | * | 10/2016 | Lee | F24F 5/0042 |

FOREIGN PATENT DOCUMENTS

| | | |
|---|---|---|
| JP | 06-069550 A | 3/1994 |
| JP | H06-69550 * | 3/1994 |
| JP | 2002-210321 * | 7/2002 |
| JP | 2002-210321 A | 7/2002 |
| KR | 10-2013-0000864 A | 1/2013 |
| KR | 10-2013-0024621 A | 3/2013 |
| KR | 10-2013-0130578 A | 12/2013 |
| WO | 2012/177072 A2 | 12/2012 |

OTHER PUBLICATIONS

Office Action dated Aug. 5, 2019 in Chinese Application No. 201680020137.0.

* cited by examiner

FIG. 10
(a)
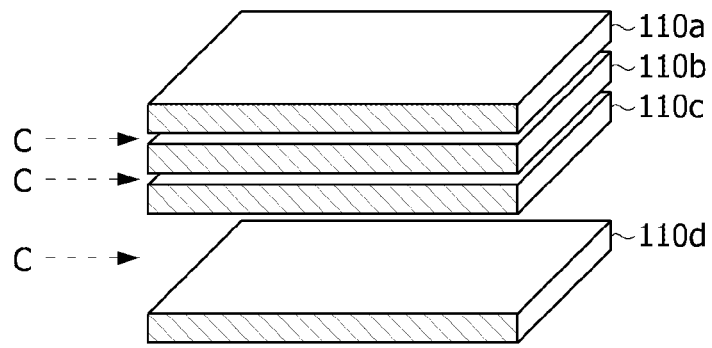
(b)
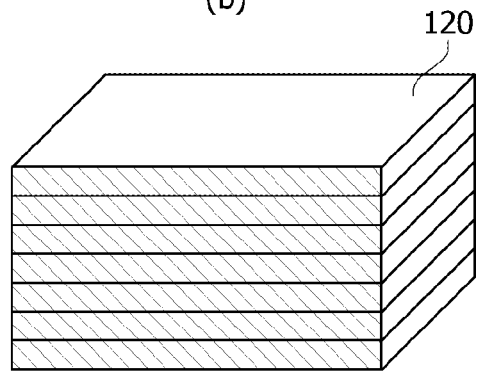
(c)
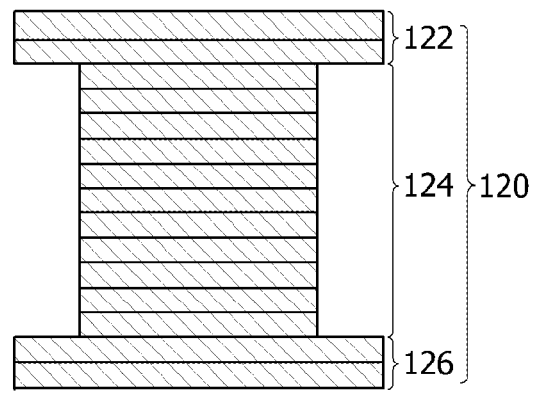
(d)

FIG. 11
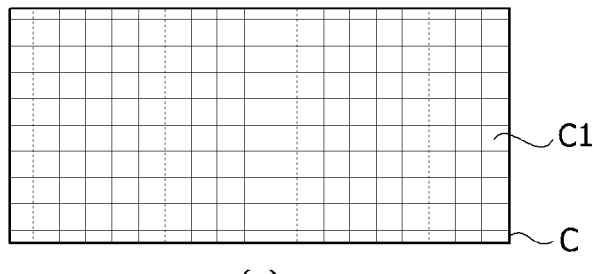
(a)
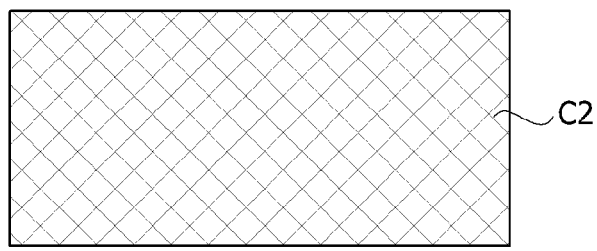
(b)
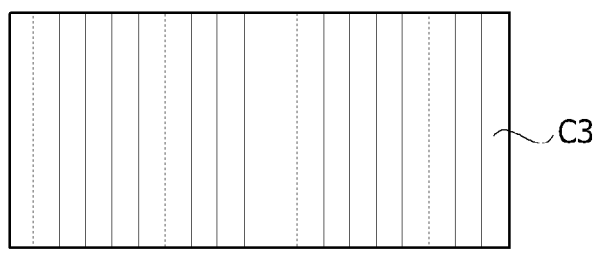
(c)
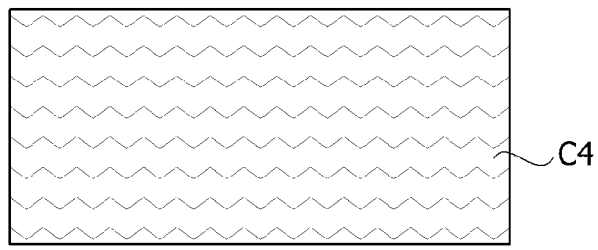
(d)

FIG. 12
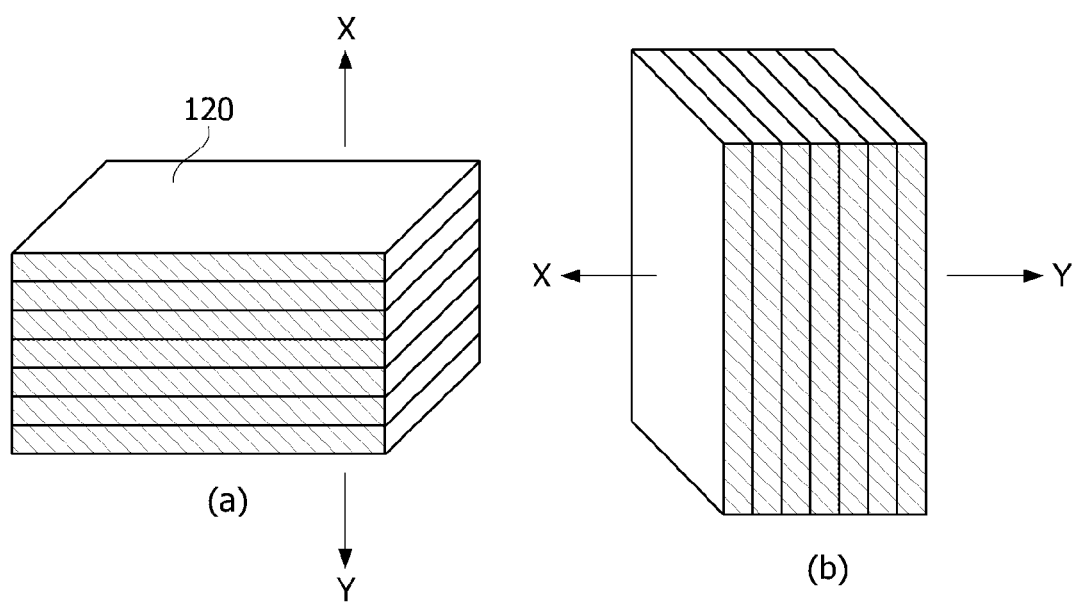
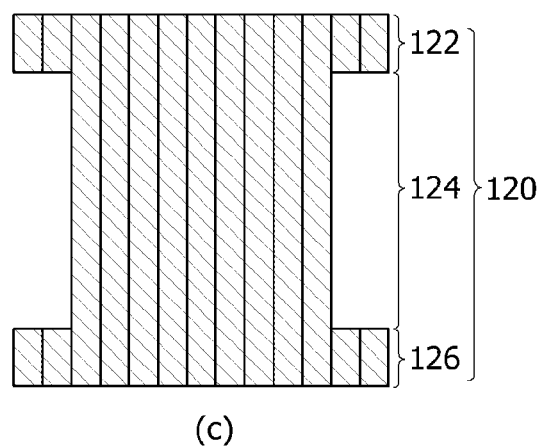

DEHUMIDIFIER

CROSS-REFERENCE TO RELATED APPLICATIONS

This application is the U.S. national stage application of International Patent Application No. PCT/KR2016/003247, filed Mar. 30, 2016, which claims priority to Korean Application No. 10-2015-0045010, filed Mar. 31, 2015, the disclosures of each of which are incorporated herein by reference in their entirety.

TECHNICAL FIELD

The present invention relates to a dehumidifier using a thermoelectric module.

BACKGROUND ART

Dehumidification is a principle in which moisture in air is removed using a dew condensation phenomenon in which moisture in air is condensed into water using a temperature difference. An apparatus that uses this principle is a dehumidifier. Recently, needs for dehumidifiers that keep a comfortable state by removing moisture in a humid indoor space as well as humidifiers that keep humidity in a dry indoor space, have been increased in an indoor space, such as home or an office.

Until now, a cooling dehumidification method (referred to as a compressor method), whereby heat is taken and dehumidification is performed using a method such as dehumidification, and a heating dehumidification method (referred to as a desiccant method), whereby dehumidification is performed using heat, have been mainly used.

In particular, in case of the cooling dehumidification method, after moisture of humid air is primarily condensed and discharged using a refrigerant, the air is dried again. Thus, dehumidification effects depend on the capacity of a compressor and thus, there is a limitation. Also, a compressor has to be excessively operated for dehumidification of a limited quantity so that much noise occurs.

DISCLOSURE

Technical Problem

The present invention is directed to providing a dehumidifier that is capable of discharging air by reducing the temperature of the air after being dehumidified while maintaining high dehumidification efficiency.

Technical Solution

One aspect of the present invention provides a dehumidifier including: a dehumidification module including a compressor unit for compressing a refrigerant, a cooling unit for cooling air through the refrigerant, and a drying unit for drying air that passes through the cooling unit; and a thermoelectric module including a first substrate, a second substrate disposed to face the first substrate, a thermoelectric element disposed between the first substrate and the second substrate, a first heat conversion unit connected to the first substrate and disposed adjacent to the drying unit of the dehumidification module, and a second heat conversion unit connected to the second substrate and disposed adjacent to the cooling unit of the dehumidification module.

Advantageous Effects

According to an embodiment of the present invention, a dehumidifier having excellent dehumidification performance in which the temperature of air discharged after dehumidification is not high, can be acquired.

DESCRIPTION OF DRAWINGS

FIGS. 9 through 12 are schematic views of a thermoelectric element according to another embodiment, which is applied to the thermoelectric module according to the embodiment of the present invention.

MODES OF THE INVENTION

Figure 1:
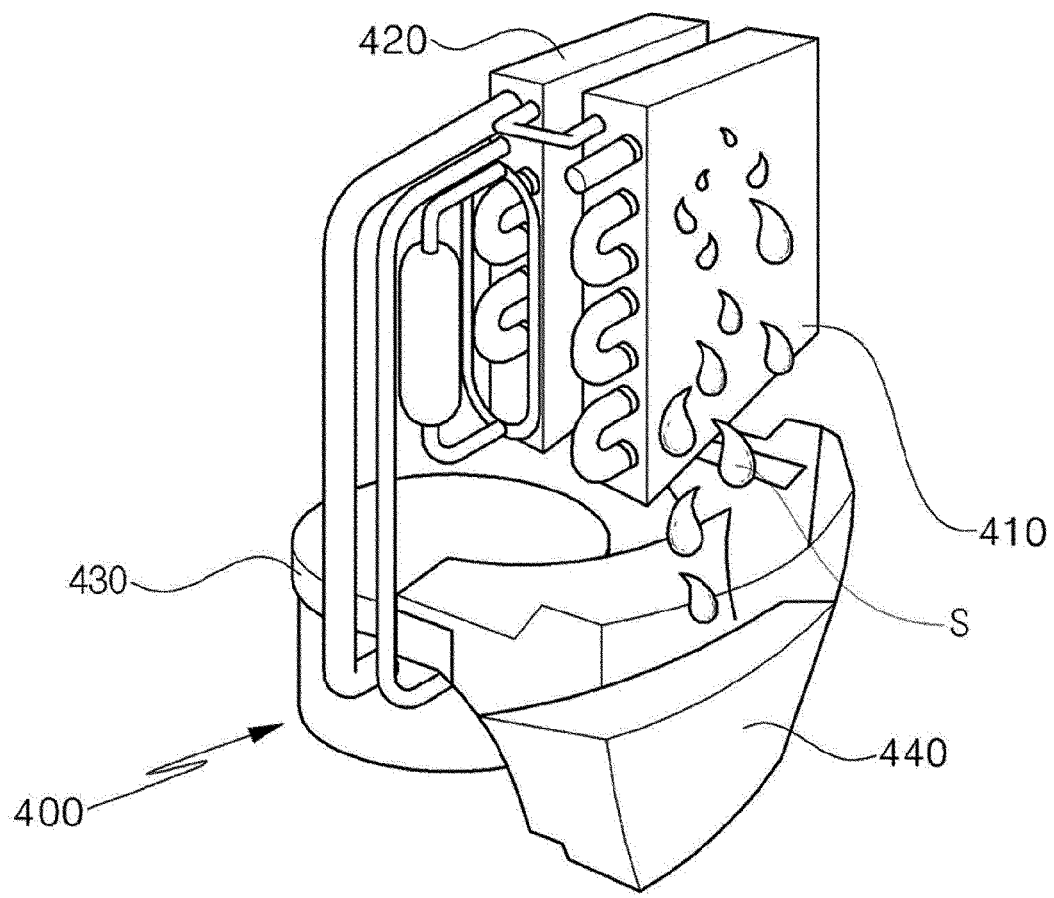
FIG. 1 is a structural diagram for explaining a basic principle of a dehumidification module.

Hereinafter, a configuration and an operation of the present invention will be described in detail with reference to the attached drawings. In description with reference to the attached drawings, like reference numerals are used for like elements regardless of a drawing number, and redundant descriptions thereof will be omitted. It will be understood that, although the terms first, second, etc. may be used herein to describe various elements, these elements should not be limited by these terms. These terms are only used to distinguish one element from another.

Figure 2:
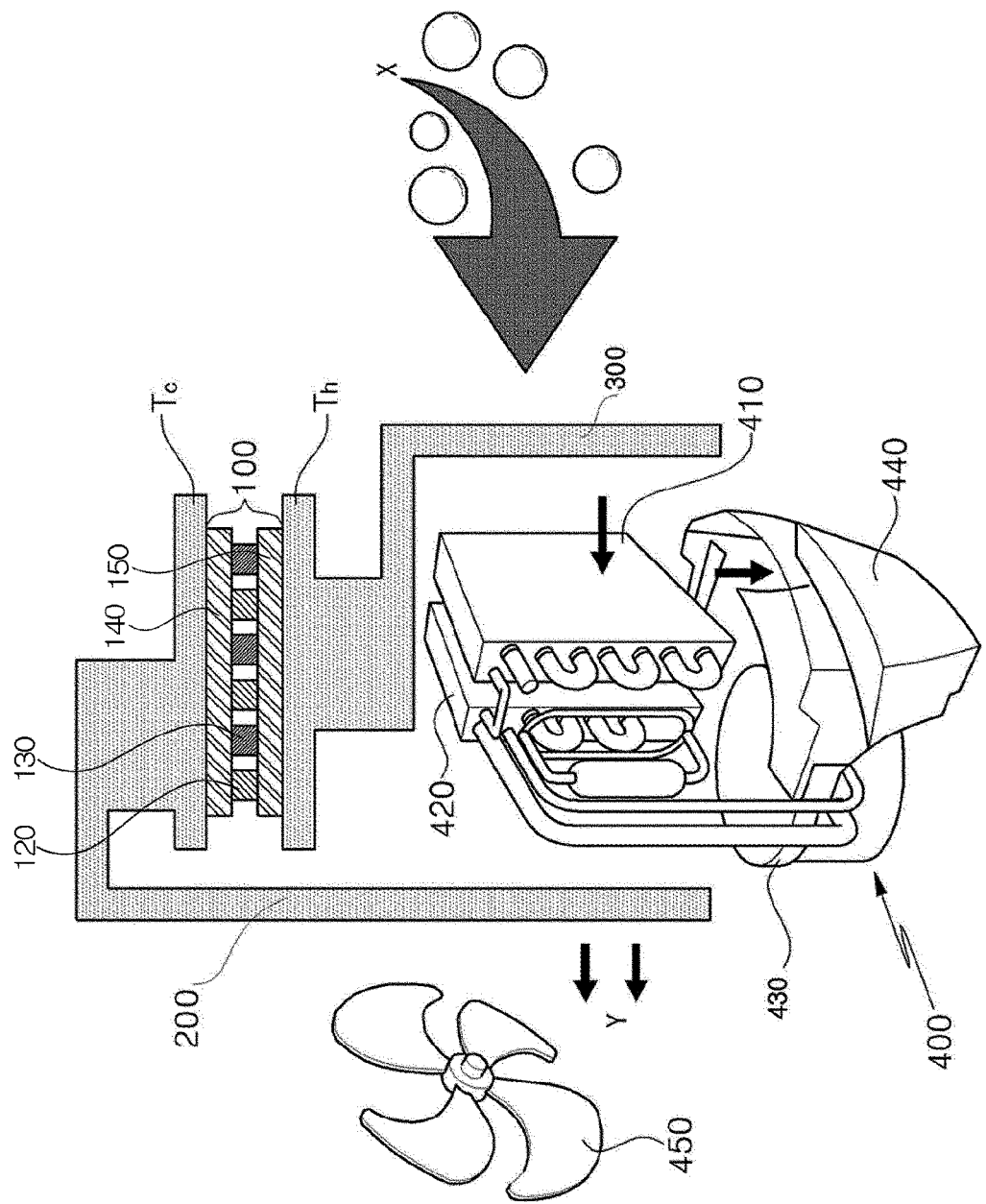
FIG. 2 is a conceptual view for explaining the structure of a dehumidifier according to an embodiment of the present invention to which a thermoelectric module is applied to FIG. 1.

FIG. 1 is a structural diagram for explaining a basic principle of a dehumidification module, and FIG. 2 is a conceptual view for explaining the structure of a dehumidifier according to an embodiment of the present invention to which a thermoelectric module is applied to FIG. 1.

Referring to FIGS. 1 and 2, a dehumidification module 400 includes a compressor unit 430 that condenses a refrigerant, a cooling unit 410 that discharges moisture S included in humid air to an external reservoir 440 using the compressed refrigerant, and a drying unit 420 that dries air that passes through the cooling unit 410 again. However, a cooling capacity of the dehumidifier depends on the capacity of a compressor included in the compressor unit 430. Thus, there is a limitation in which the temperature of the air may be decreased. When the dehumidified air passes through the drying unit 420, the temperature of the air rises. Thus, a user's uncomfortableness can be increased. Furthermore, for strong humidification, an operating quantity of the compressor has to be increased so that noise occurs.

Thus, as illustrated in FIG. 2, the dehumidifier according to the embodiment of the present invention includes a first substrate 140, a second substrate 150 disposed to face the first substrate 140, thermoelectric elements 120 and 130 disposed between the first substrate 140 and the second substrate 150, and a thermoelectric module 100 including a first heat conversion unit 200 connected to the first substrate 140 and disposed adjacent to the drying unit 420 of the dehumidification module 400 and a second heat conversion unit 300 connected to the second substrate 150 and disposed adjacent to the cooling unit 410 of the dehumidification module 400, based on the dehumidification module 400 described in FIG. 1. According to the embodiment of the present invention, the thermoelectric module 100 realizes a heat conversion effect by passing air to be introduced into the dehumidification module 400 through the thermoelectric module 100.

The thermoelectric module 100 has a structure in which the thermoelectric semiconductor elements 120 and 130 electrically connected to each other are disposed between a pair of facing substrates 140 and 150. The thermoelectric semiconductor elements 120 and 130 include a pair of a P-type semiconductor element and an N-type semiconductor element, and when a current is applied to the thermoelectric semiconductor elements 120 and 130, the pair of substrates described above may be implemented with a heat absorption portion and a heat dissipation portion due to a Peltier effect. In the present specification, the P-type semiconductor element may be used together with a P-type thermoelectric element, and the N-type semiconductor element may be used together with an N-type thermoelectric element. In the embodiment of the present invention, the case where, in the structure of FIG. 2, the first substrate 140 serves as a heat absorption portion, the second substrate 150 serves as a heat dissipation portion, the first heat conversion unit 200 serves as a heat absorption (cooling) region and the second heat conversion unit 300 serves as a heat dissipation region, will be described.

The air from which condensed moisture is discharged by passing through the cooling unit 410, passes through the drying unit 420 and is secondarily dried so that dehumidification can be performed. Subsequently, the air after passing through the drying unit 420 may be cooled while passing through the first heat conversion unit 200. Thus, according to the embodiment of the present invention, dehumidification is performed and simultaneously, the temperature of discharged air may be decreased so that the user's comfortableness can be increased. Furthermore, in order to reinforce a circulation effect of air, the dehumidifier may further include an air circulation module 450 disposed adjacent to the first heat conversion unit 200 or the second heat conversion unit 300, and the air circulation module 450 may be a fan, for example.

Figure 3:
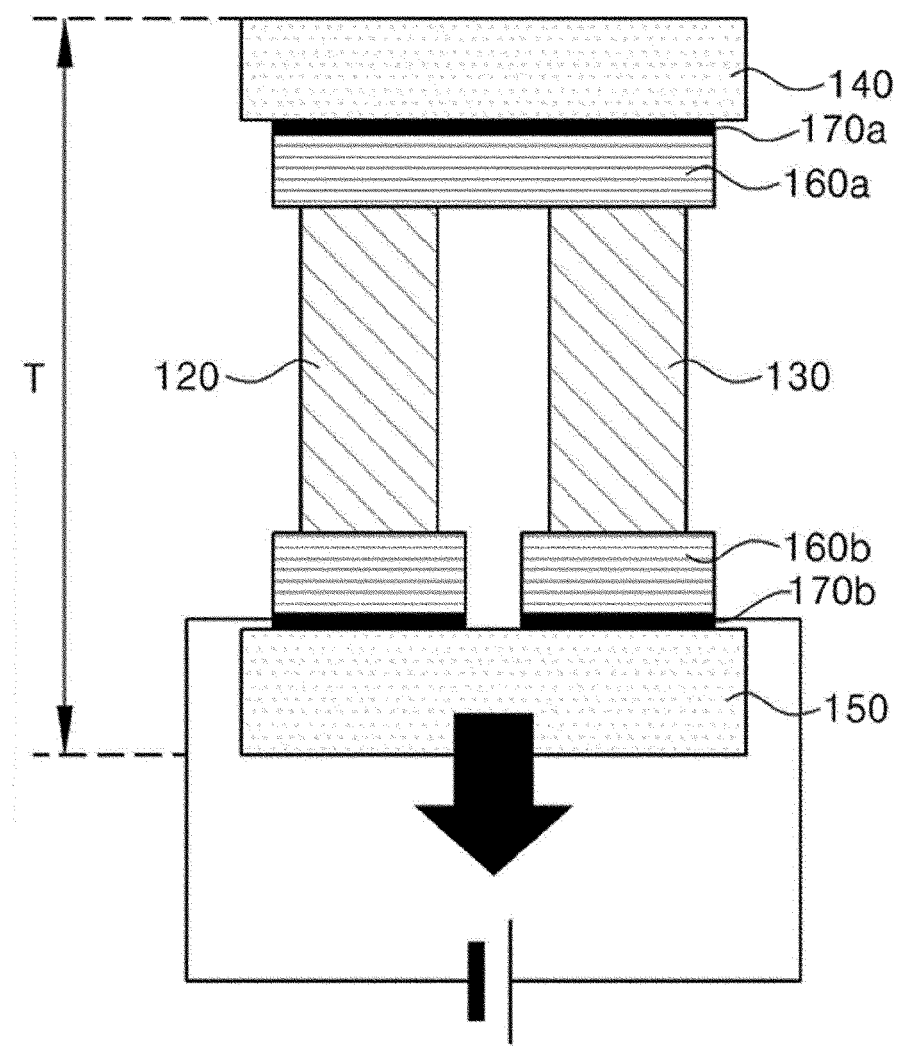
FIG. 3 is a cross-sectional view of an important part of the thermoelectric module according to the embodiment of the present invention applied to the dehumidifier of FIG. 2.
Figure 4:
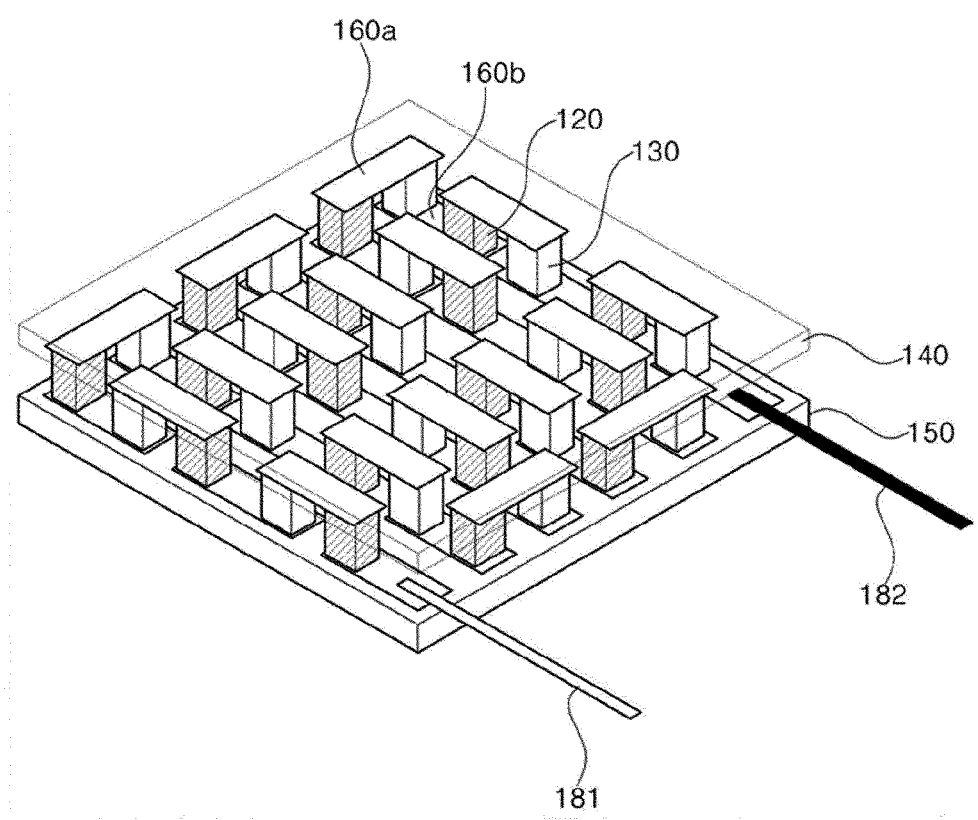
FIG. 4 is a view of the structure of FIG. 2 that is modularized and extended.

FIG. 3 is a cross-sectional view of an important part of the thermoelectric module according to the embodiment of the present invention applied to the dehumidifier of FIG. 2, and FIG. 4 is a view of the structure of FIG. 2 that is modularized and extended. Also, FIGS. 5 through 8 illustrate the structure of the dehumidifier according to the embodiment of the present invention and the structure of a heat conversion unit.

Referring to FIGS. 2 through 4, the thermoelectric module 100 applied to the dehumidifier according to the embodiment of the present invention is implemented in a structure in which the first semiconductor element 120 and the second semiconductor element 130 are disposed between the first substrate 140 and the second substrate 150 facing the first substrate 140. In particular, the first heat conversion unit 200 that performs a cooling operation is disposed on the first substrate 140 to perform the cooling operation, and the second heat conversion unit 300 that performs a heat dissipation function is installed on the second substrate 150 to perform a drying function.

Figure 5:
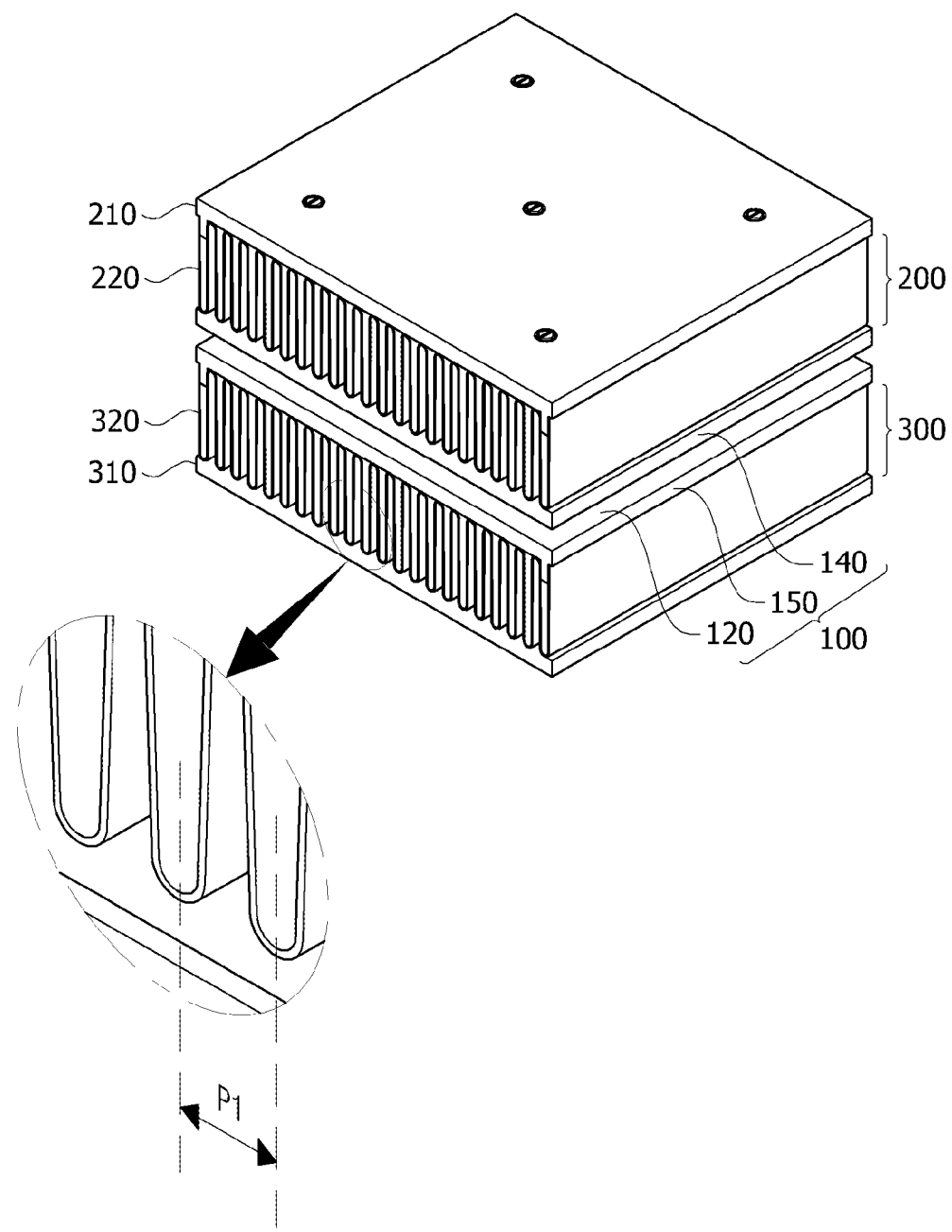
FIGS. 5 through 8 are conceptual views for explaining an important part of a heat conversion member applied to the thermoelectric module according to the embodiment of the present invention.

In particular, each of the first heat conversion unit 200 and the second heat conversion unit 300 may include a heat conversion member that is in contact with air with a predetermined pitch and is capable of implementing a cooling or heat dissipation effect using the first substrate 140 and the second substrate 150, as illustrated in FIG. 5.

Referring to FIGS. 2 and 5, the first heat conversion unit 200 and the second heat conversion unit 300 thermally converts air introduced from the outside or discharged to the outside using a thermoelectric effect implemented with the first substrate 140 and the second substrate 150 of the thermoelectric module 100.

To this end, the first heat conversion unit 200 may include a heat conversion member 220 disposed on the first substrate 140. This structure is the same as a structure of the second heat conversion unit 300 in which a heat conversion member 320 is disposed on the second substrate 150. Thus, hereinafter, the structure of the first heat conversion unit 200 in which the heat conversion member 220 is disposed, will be described. The heat conversion unit 200 may be in contact with the first substrate 140, as illustrated in FIG. 5, and air of which temperature rises by passing the cooling unit 410 and the drying unit 420, may be cooled using the heat conversion unit 200. According to a design, the structure of FIG. 5 may be modified into a structure in which the first heat conversion unit 200 is disposed in a first region Tc that contacts the first substrate 140 and in a position extending from the first region Tc and facing the drying unit 420, as illustrated in FIG. 2. Furthermore, the structure of FIG. 5 may be modified into a structure in which the second heat conversion unit 300 is disposed in a third region Th that contacts the second substrate 150 and in a position extending from the third region Th and facing the cooling unit 410.

Figure 6:
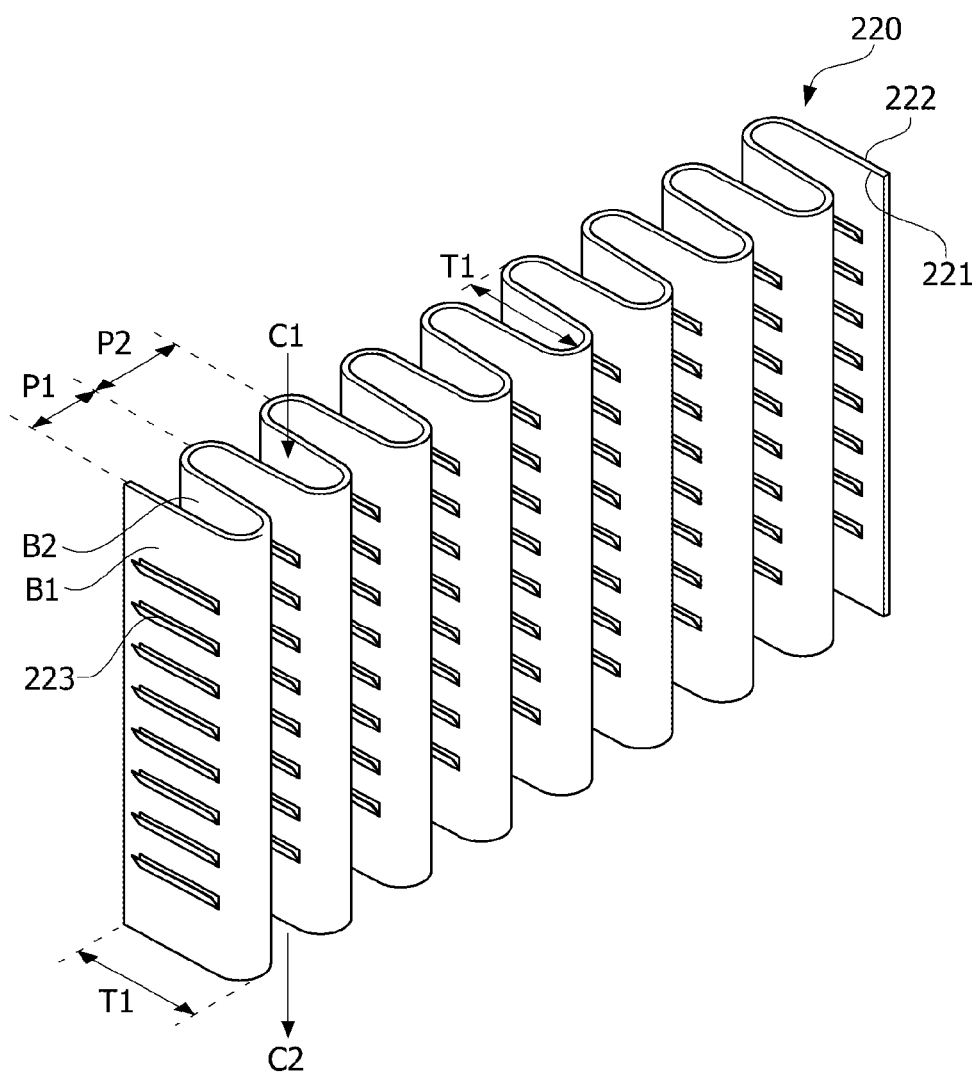

Referring to FIGS. 5 and 6, the heat conversion members 220 and 320 may be disposed within additional accommodation modules 210 and 310.

The heat conversion units 200 and 300 are disposed on a pair of the first substrate 140 and the second substrate 150. In the illustrated structure, the heat conversion members 220 and 320 are in direct contact with surfaces of the first substrate 140 and the second substrate 150. However, as illustrated in FIG. 2, the heat conversion members 220 and 320 may be disposed in the first region Tc or the third region Th that contacts the substrate, and in a second region and a fourth region, which extend from the first region Tc and the third region Th and are air discharge surfaces, as described above.

In a heat conversion apparatus according to an embodiment of the present invention, the heat conversion members 220 and 320 that are in contact with the first substrate 140 and the second substrate 150 and perform heat conversion, may include surfaces that contact air, liquid, etc., and may be implemented to include flow path grooves so as to maximize a contact area.

Figure 7:
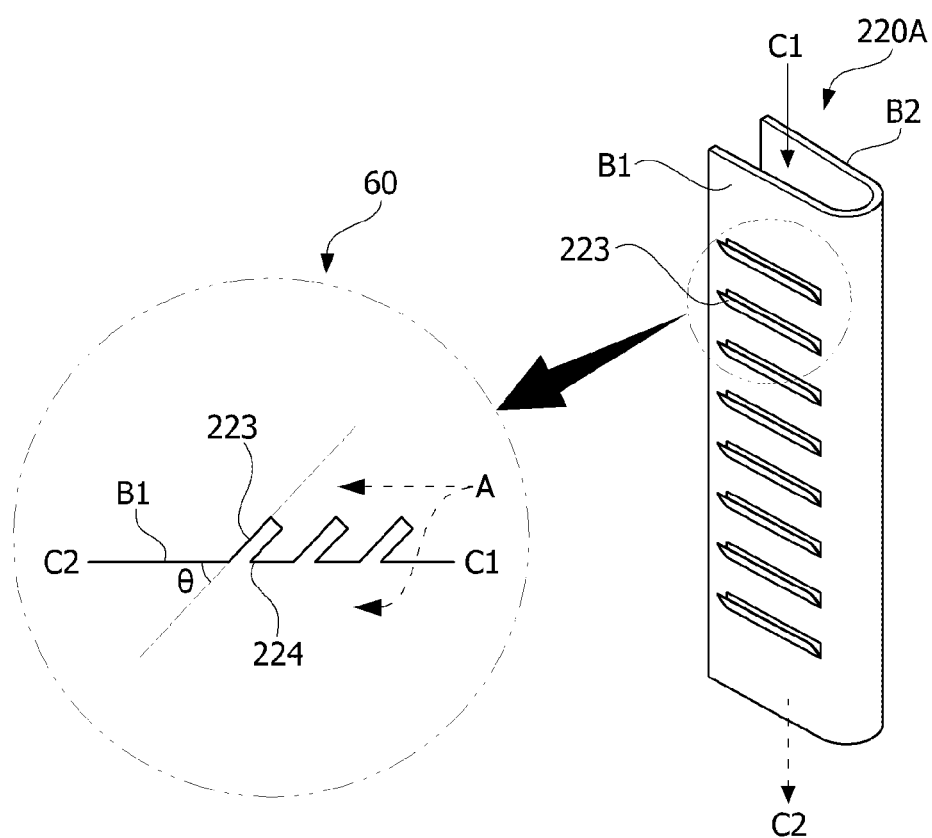

FIG. 6 illustrates a structure of the heat conversion member 220, which is included in a heat conversion unit according to the embodiment of the present invention, according to an embodiment, and FIG. 7 is an expanded conceptual view of a structure in which one flow path pattern 220A is formed in the heat conversion member 220.

As illustrated in the drawing, the heat conversion member 220 may be configured with a structure in which at least one flow path pattern 220A in which an air flow path C1 that is a movement path of uniform air is formed on a flat plate-shaped substrate of a first plane 221 and a second plane 222 that is an opposite plane to the first plane 221 so as to perform surface contact with air, is implemented.

The flow path pattern 220A may also be configured to have a structure for folding the substrate so that curvature patterns having predetermined pitches P1 and P2 and a height T1 of the curvature patterns can be formed, as illustrated in FIG. 6, i.e., in a folding structure. That is, the heat conversion members 220 and 320 according to the embodiment of the present invention may be implemented in a structure in which two surfaces contact air and a flow path pattern for maximizing a contact surface area is formed.

In the structure of FIG. 6, when air is introduced in a direction of the air flow path C1 of an introduction portion, air uniformly contacts the above-described first plane 221 and the second plane 222 that is an opposite plane to the first plane 221 and moves to proceed in a direction of an end C2 of the air flow path. Thus, contact with much air is lead in the same space than on a contact surface with a simple flat plate shape so that the effect of heat absorption or heat dissipation can be further improved.

In particular, in order to further increase a contact area with air, the heat conversion member 220 according to the embodiment of the present invention may also include a resistive pattern 223 formed on the surface of the substrate, as illustrated in FIGS. 6 and 7. The resistive pattern 223 may be formed on a first curve surface B1 and a second curve surface B2, respectively, in consideration of a unit flow path pattern. The resistive pattern may be implemented to protrude from one of the first plane 221 and the second plane 222 that faces the first plane 221.

Furthermore, the heat conversion member 220 may further include a plurality of fluid flow grooves 224 through which the surface of the substrate passes. Thus, air contact and movement can be more freely performed between a first plane and a second plane of the heat conversion member 240.

In particular, as in a partially-expanded view of FIG. 7, the resistive pattern 223 may be formed in an inclined protrusion structure to have an inclination angle θ in a direction in which air is introduced, so that friction with air can be maximized and a contact area or contact efficiency can be further improved. More preferably, the inclination angle θ is formed in such a way that a horizontal extension line of the surface of the resistive pattern and an extension line of the surface of the substrate form an acute angle, and this is because, in case of a right angle or obtuse angle, the effect of resistance is reduced.

Furthermore, the above-described fluid flow groove 224 is formed in a connection part of the resistive pattern and the substrate so that resistance of the fluid such as air is increased and simultaneously, movement thereof to an opposite side can be effectively performed. In detail, the fluid flow groove 224 is formed on the surface of the substrate of a front part of the resistive pattern 223 so that a part of air contacting the resistive pattern 223 passes through front and rear surfaces of the substrate and thus the frequency or an area of contact can be further increased.

In FIG. 7, the flow path pattern is formed with predetermined pitches and a predetermined period. However, unlike this, pitches of a unit pattern may not be uniformly made and the period of the unit pattern may be also nonuniformly implemented. Furthermore, a height T1 of each unit pattern may be also nonuniformly modified.

Figure 8:
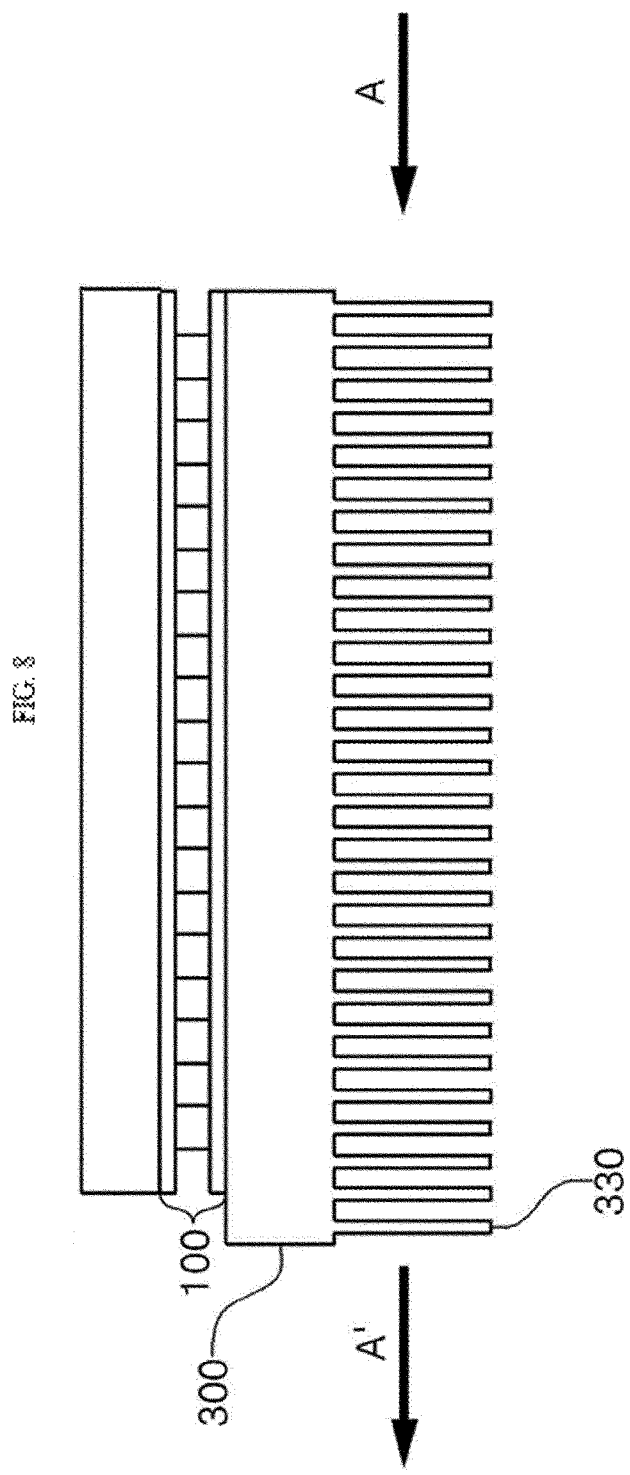

In FIG. 5, one heat conversion member is included in a heat conversion module in a heat transfer apparatus according to an embodiment of the present invention. However, in another embodiment as illustrated in FIG. 8, a plurality of heat conversion members 330 may be stacked on one heat transfer module. Thus, a contact surface area with air can be further maximized. This structure is implemented to implement many contact surfaces in a narrow area due to characteristics of the heat conversion members 330 formed in a folding structure according to the present invention. Thus, more heat conversion members 330 can be disposed in the same volume. Of course, in this case, a support substrate, such as a second intermediate member, may be further disposed between heat conversion members 330 to be stacked. Furthermore, in another embodiment of the present invention, the dehumidifier may also include two or more thermoelectric modules.

Also, a pitch of a heat conversion member of a thermoelectric module (second substrate) that forms a heat dissipation portion and a pitch of a heat conversion member of a thermoelectric module (first substrate) that forms a heat absorption portion may also be different from each other. In this case, in particular, a pitch of a flow path pattern of a heat conversion member in the heat conversion module that forms the heat dissipation portion may be equal to or greater than a pitch of a flow path pattern of a heat conversion member in the heat conversion module that forms the heat absorption portion. In this case, the ratio of the pitch of the first heat conversion member of the first heat conversion unit with respect to the pitch of the first heat conversion member of the second heat conversion unit may be formed in the range of (0.5 to 2.0):1.

In the structure of the heat conversion member that forms a flow path pattern according to the embodiment of the present invention, much more contact areas can be implemented within the same volume than a heat conversion member having a flat plate-shaped structure or an existing heat dissipation fin structure. Thus, the air contact area can be increased by 50% or more compared to the heat conversion member having the flat plate structure. Thus, the size of a module can also be greatly reduced. Furthermore, the heat conversion member may be formed of various materials, such as metal having high heat transfer efficiency such as aluminum, synthetic resin, and the like.

Hereinafter, the structure of a thermoelectric module applied to the dehumidifier according to the embodiment of the present invention described in FIG. 1 will be described with reference to FIGS. 3 and 4 in more detail.

The thermoelectric module including a thermoelectric element according to the embodiment of the present invention may be formed to have a structure including at least one unit cell including a first substrate 140 and a second substrate 150 that face each other, and a first semiconductor element 120 and a second semiconductor element 130, which are disposed between the first substrate 140 and the second substrate 150, wherein the second semiconductor element 130 is electrically connected to the first semiconductor element 120. The first substrate 140 and the second substrate 150 may be insulating substrates, for example, alumina substrates. Alternatively, in another embodiment, the first substrate 140 and the second substrate 150 may be metal substrates so that heat absorption and heat dissipation efficiency and small thickness can be achieved. Of course, when the first substrate 140 and the second substrate 150 are metal substrates, preferably, one unit cell further includes dielectric layers 170a and 170b formed between electrode layers 160a and 160b formed on the first substrate 140 and the second substrate 150. When the first substrate and the second substrate are implemented integrally with a third substrate of a first module 200 and a fourth substrate of a second module 300, the first substrate and the second substrate may be formed of a material such as alumina, copper (Cu), or a Cu alloy.

A metal substrate may be formed of Cu or a Cu alloy, and a thickness of the metal substrate that may be made small, may be in the range of 0.1 to 0.5 mm. When the thickness of the metal substrate is smaller than 0.1 mm or exceeds 0.5 mm, heat dissipation characteristics are excessively high or thermal conductivity is too high so that reliability of the thermoelectric module is greatly lowered. Also, the dielectric layers 170a and 170b are formed of a material having thermal conductivity of 5 to 10 W/K as a dielectric material having high dissipation performance in consideration of thermal conductivity of a thermoelectric module for cooling, and thicknesses of the dielectric layers 170a and 170b may be in the range of 0.01 to 0.15 mm. In this case, when the thicknesses of the dielectric layers 170a and 170b are less than 0.01 mm, insulation efficiency (or withstanding voltage characteristics) is greatly lowered, and when the thicknesses of the dielectric layers 170a and 170b exceed 0.15 mm, thermal conductivity is lowered so that heat dissipation efficiency is lowered. The electrode layers 160a and 160b electrically connect a first semiconductor element to a second semiconductor element using an electrode material, such as Cu, silver (Ag), nickel (Ni), or the like, and when a plurality of unit cells illustrated are connected to one another, they are electrically connected to adjacent unit cells, as illustrated in FIG. 3. Thicknesses of the electrode layers 160a and 160b may be in the range of 0.01 to 0.3 mm. When the thicknesses of the electrode layers 160a and 160b are less than 0.01 mm, the function of the electrode layers 160a and 160b is lowered so that electrical conductivity thereof is lowered, and even when the thicknesses of the electrode layers 160a and 160b exceed 0.3 mm, conduction efficiency is lowered due to an increase in resistance.

In particular, in this case, the thermoelectric element that forms a unit cell, may be a thermoelectric element including a unit element having a stack type structure according to an embodiment of the present invention. In this case, the thermoelectric element may include a P-type semiconductor as the first semiconductor element 120 and an N-type semiconductor as the second semiconductor element 130, and the first semiconductor element 120 and the second semiconductor element 130 are connected to the metal electrodes 160a and 160b, and a plurality of structures are formed, and a Peltier effect is achieved due to circuit lines 181 and 182 through which a current is supplied to the semiconductor element via an electrode.

The semiconductor element in the thermoelectric module may be formed of a P-type semiconductor or N-type semiconductor material. The N-type semiconductor element may be formed of the N-type semiconductor material using a mixture of a bismuth telluride base (BiTe base) main raw material including selenium (Se), Ni, aluminum (Al), Cu, Ag, lead (Pb), boron (B), gallium (Ga), tellurium (Te), bismuth (Bi), and indium (In) and Bi or Te that corresponds to 0.001 to 1.0 wt % of the entire weight of the main raw material. For example, the N-type semiconductor element may be formed by using a Bi—Se—Te material as the main raw material and adding Bi or Te that corresponds to 0.001 to 1.0 wt %/o of the entire weight of the Bi—Se—Te material. That is, when the weight of 100 g of the Bi—Se—Te material is used, preferably, Bi or Te to be additionally mixed is in the range of 0.001 to 1.0 g. As described above, when the weight range of the material added to the above-described main raw material is out of 0.001 to 0.1 wt %, thermal conductivity is not lowered, and electrical conductivity is lowered so that improvements in a ZT value cannot be expected.

Preferably, the P-type semiconductor element is formed of the P-type semiconductor material using a mixture of a bismuth telluride base (BiTe base) main raw material including antimony (Sb), Ni, Al, Cu, Ag, Pb, B, Ga, Te, Bi, and In and Bi or Te that corresponds to 0.001 to 1.0 wt % of the entire weight of the main raw material. For example, the P-type semiconductor element may be formed by using a Bi—Sb—Te material as the main raw material and adding Bi or Te that corresponds to 0.001 to 1.0 wt % of the entire weight of the Bi—Sb—Te material. That is, when the weight of 100 g of the Bi—Sb—Te material is used, Bi or Te to be additionally mixed may be in the range of 0.001 to 1.0 g. As described above, when the weight range of the material added to the above-described main raw material is out of 0.001 to 0.1 wt %, thermal conductivity is not lowered, and electrical conductivity is lowered so that improvements in a ZT value cannot be expected.

Shapes and sizes of the first semiconductor element and the second semiconductor element that form a unit cell and face each other, are the same. However, in this case, electrical conductivity of the P-type semiconductor element and electrical conductivity of the N-type semiconductor element are different from each other, which causes lowering of cooling efficiency. In consideration of this, a volume of one semiconductor element may be different from a volume of the other semiconductor element that faces the one semiconductor element so that cooling performance can be improved.

That is, volumes of semiconductor elements of a unit cell disposed to face each other may be different from each other by differently forming the entire shapes of the semiconductor elements or increasing the diameter of a cross-section of one semiconductor of semiconductor elements having the same heights, or by differently forming heights or diameters of cross-sections of the semiconductor elements having the same shapes. In particular, the diameter of the N-type semiconductor element is formed to be larger than that of the P-type semiconductor element so that the volume of the N-type semiconductor element is increased and thus thermoelectric efficiency can be improved.

Figure 9:
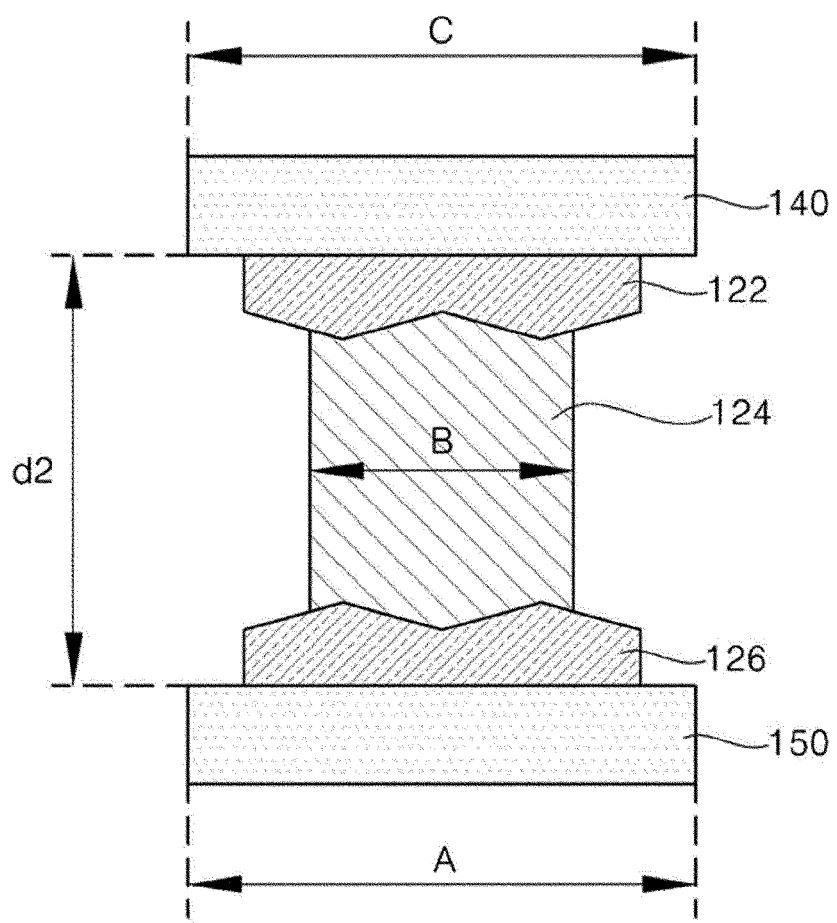

FIG. 9 illustrates a modified embodiment in which the shape of the thermoelectric element described in FIG. 3 is changed.

Referring to FIGS. 3 and 9, a thermoelectric element 120 according to another modified embodiment of the present invention includes a first element unit 122 having a first cross-sectional area, a second element unit 126 having a second cross-sectional area in a position that faces the first element unit 122, and a connection portion 124 that has a third cross-sectional area and connects the first element unit 122 to the second element unit 126. In particular, in this case, a cross-sectional area of the connection portion 124 in a horizontal, certain region may be smaller than the first cross-sectional area and the second cross-sectional area.

Through this structure, when a material of the same quantity as that of a thermoelectric element having a single cross-section like the structure of a regular hexahedron structure with the same material is used, the area of the first element unit and the area of the second element unit are increased, and the length of the connection portion is long so that a temperature difference ΔT between the first element unit and the second element unit can be increased. By increasing this temperature difference, the quantity of free electrons that move between a hot side and a cold side increases so that the quantity of power generation of electricity is increased and heat dissipation or cooling efficiency is improved.

Thus, in the thermoelectric element 120 according to the current embodiment, horizontal cross-sections of the first element unit 122 and the second element unit 126, which are implemented at upper and lower portions of the connection portion 124 in a flat plate type structure or another stereoscopic structure, are increased, and the length of the connection portion 124 extends so that a cross-sectional area of the connection portion 124 can be reduced. In particular, in the embodiment of the present invention, the ratio of a width B of a cross-section having a longest width of the horizontal cross-sections of the connection portion 124 with respect to a width A or C of a larger cross-section of the horizontal cross-sections of the first element unit 122 and the second element unit 126 may be in the range of 1: (1.5 to 4). When the ratio of the width B of a cross-section having a longest width of the horizontal cross-sections of the connection portion 124 with respect to the width A or C of a larger cross-section of the horizontal cross-sections of the first element unit 122 and the second element unit 126 is out of the range, thermal conductivity moves from the hot side to the cold side so that power generation efficiency is lowered or heating or cooling efficiency is lowered.

In another aspect of the embodiment of this structure, longitudinal thicknesses a1 and a3 of the first element unit 122 and the second element unit 126 of the thermoelectric element 120 may be smaller than a longitudinal thickness s2 of the connection portion 124.

Furthermore, in the present embodiment, the first cross-section that is a horizontal cross-section of the first element unit 122 and the second cross-section that is a horizontal cross-section of the second element unit 126 may be differently implemented. This is to easily control a desired temperature difference by adjusting thermoelectric efficiency. Furthermore, the first element unit 122, the second element unit 126, and the connection portion 124 may be integrally implemented. In this case, each configuration may be implemented with the same materials.

FIG. 10 illustrates an example in which the structure of a thermoelectric element according to the embodiment of the present invention described in FIGS. 3 and 9 is implemented with different construction and configuration.

Referring to FIG. 10, in another embodiment of the present invention, the structure of the above-described semiconductor element may be implemented with a stack type structure (not a bulk type structure) so that small thickness and cooling efficiency can be further improved. In detail, the structure of the first semiconductor element 120 and the second semiconductor element 130 in FIG. 3 or 9 is formed as a unit member in which a plurality of structures in which a semiconductor material is applied to a sheet-shaped substrate are stacked, and then the unit member is cut so that damage of a material can be prevented and electrical conductivity can be improved.

With respect to this, referring to FIG. 10, FIG. 10 is a conceptual view of a process of manufacturing the unit member having the above-described stack structure. Referring to FIG. 10, a material including a semiconductor material is manufactured in the form of a paste, and the paste is applied onto a substrate 111, such as a sheet or film, and a semiconductor layer 112 is formed so that one unit member 110 can be formed. A plurality of unit members 100a, 100b, and 100c are stacked so that a stack structure can be formed, and subsequently, the stack structure is cut so that a unit thermoelectric element 120 can be formed, as illustrated in FIG. 2. That is, the unit thermoelectric element 120 according to the present invention may be formed with a structure in which a plurality of unit members 110 on which a semiconductor layer 112 is stacked on the substrate 111, are stacked.

In the above-described process, a process of applying a semiconductor paste onto the substrate 111 may be implemented using various methods. For example, the process of applying the semiconductor paste onto the substrate 111 may be implemented by tape casting, i.e., a process in which a very fine semiconductor material powder is mixed with one selected from the group consisting of an aqueous or non-aqueous solvent, a binder, a plasticizer, a dispersant, a defoamer, and a surfactant to prepare a slurry and then the slurry is formed on a moving blade or transportation substrate to a predetermined thickness according to a desired purpose. In this case, a material such as a film or sheet having a thickness of 10 to 100 um may be used, and the applied semiconductor material may be a P-type material or an N-type material used to form the above-described bulk type element without any change.

A process of aligning the unit members 110 in a multi-layer and stacking the unit members 110 may be performed by pressing the unit members 110 at a temperature of 50° C. to 250° C. and forming the unit members 110 in a stack structure, and in the embodiment of the present invention, the number of stacks of the unit members 110 may be in the range of 2 to 50. Subsequently, a cutting process may be performed in a desired shape and size, and a sintering process may be added.

In a unit thermoelectric element in which a plurality of unit members 110 manufactured in the above-described process are stacked, uniformity of thickness, shape, and size of the unit thermoelectric element can be acquired. That is, in an existing bulk-shaped thermoelectric element, after an ingot grinding process and a refining ball-mill process are performed, a sintered bulk structure is cut. Thus, there are many lost materials in a cutting process, and it is difficult to cut the materials to have uniform sizes, and thicknesses of the materials are about 3 to 5 mm, large so that small thickness cannot be easily implemented. However, in the unit thermoelectric element having the stack type structure according to the embodiment of the present invention, after sheet-shaped unit members are stacked in a multi-layer, a sheet stack structure is cut. Thus, there is hardly loss of the materials, and the materials have uniform thicknesses so that uniformity of the materials can be acquired and the thickness of the entire unit thermoelectric element is 1.5 mm or less so that small thickness can be implemented, and the unit thermoelectric element can be manufactured in various forms. A finally-implemented structure is cut in the form of (d) of FIG. 10 and thus is implemented, like the structure of FIG. 3 or the structure of the thermoelectric element described in FIG. 9.

In particular, in a process of manufacturing the unit thermoelectric element according to the embodiment of the present invention, a process of forming a conductive layer on the surface of each unit member 110 may be further added to a process of forming a stack structure of the unit member 110.

That is, a conductive layer having the structure of FIG. 11 may be formed between unit members of the stack structure of (c) of FIG. 10. The conductive layer may be formed on an opposite surface to a substrate surface on which a semiconductor layer is formed. In this case, the conductive layer may be configured with a patterned layer so that a region in which the surface of the unit member is exposed, can be formed. Thus, electrical conductivity can be improved compared to the case where the conductive layer is applied on the entire surface of the substrate, and simultaneously, an adhesive force between the unit members can be improved, and thermal conductivity can be decreased.

That is, FIG. 11 illustrates various modified embodiments of a conductive layer C according to the embodiment of the present invention. A pattern to which the surface of the unit member is exposed, may be modified and designed in various forms including a mesh type structure including closed type opening patterns $c_1$ and $c_2$, as illustrated in (a) and (b) of FIG. 11, or a line type structure including open type opening patterns $c_3$ and $c_4$, as illustrated in (c) and (d) of FIG. 11. Due to the above-described conductive layer, an adhesive force between unit members inside the unit thermoelectric element formed in a stack structure of the unit member can be improved, and thermal conductivity between the unit members can be decreased, and electrical conductivity can be improved, and a cooling capacity Qc and the temperature difference $\Delta T$ (° C.) are improved compared to the conventional bulk type thermoelectric element, and in particular, a power factor is increased by 1.5 times, i.e., electrical conductivity is increased by 1.5 times. Improvements in electrical conductivity are directly related to improvements in thermoelectric efficiency. Thus, cooling efficiency is improved. The conductive layer may be formed of a metal material, and all metal-based electrode materials such as Cu, Ag, and Ni may be used.

When the unit thermoelectric element having the stack type structure described in FIG. 10 is applied to the thermoelectric module illustrated in FIGS. 3 and 4, i.e., when a thermoelectric element according to the embodiment of the present invention is disposed between the first substrate 140 and the second substrate 150 and a thermoelectric module is implemented in a unit cell having a structure including an electrode layer and a dielectric layer, the entire thickness Th may be in the range of 1 to 1.5 mm. Thus, small thickness can be remarkably realized compared to the case where the existing bulk type element is used.

Also, as illustrated in FIG. 12, the thermoelectric elements 120 and 130 described in FIG. 6 may be aligned to be disposed horizontally in an upward direction X and in a downward direction Y, as illustrated in (a) of FIG. 12, and may be cut, as illustrated in (c) of FIG. 12 so that a thermoelectric element according to an embodiment of the present invention can also be implemented.

That is, a thermoelectric module may be formed in a structure in which a first substrate and a second substrate, a semiconductor layer and the surface of a substrate are disposed adjacent to one another. However, as illustrated in (b) of FIG. 12, a thermoelectric element itself may be stood in a vertical direction so that side portions of a unit thermoelectric element may be disposed adjacent to the first and second substrates. In this structure, a distal end of the conductive layer is exposed to the side portions other than a horizontal arrangement structure, and thermal conduction efficiency in the vertical direction can be decreased and simultaneously electrical conductivity can be improved so that cooling efficiency can be further improved. Furthermore, the shape of FIG. 9 may be cut and implemented, as illustrated in (c) of FIG. 12.

As described above, in a thermoelectric element applied to the thermoelectric module of the present invention that may be implemented in various embodiments, shapes and sizes of a first semiconductor element and a second semiconductor element that face each other are the same. However, in this case, electrical conductivity of the P-type semiconductor element and electrical conductivity of the N-type semiconductor element are different from each other so that cooling efficiency can be decreased. In this consideration, the volume of one semiconductor element is different from the volume of the other semiconductor element that faces the one semiconductor element so that cooling performance can be improved.

That is, the volumes of the semiconductor elements that face each other may be different from each other by differently forming the entire shape of the semiconductor elements, or forming a diameter of a cross-section of one of the semiconductor elements having the same heights larger than a diameter of a cross-section of the other semiconductor element, or differently forming heights or diameters of cross-sections of the semiconductor elements having the same shapes. In particular, the diameter of the N-type semiconductor element is formed to be larger than that of the P-type semiconductor element so that the volume of the entire semiconductor element can be increased and thermoelectric efficiency can be improved.

The thermoelectric element having various structures according to one embodiment of the present invention and a thermoelectric module including the same may be applied to the dehumidifier, as described above, so that dehumidification efficiency can be maximized.

While the invention has been shown and described with reference to certain exemplary embodiments thereof, it will be understood by those skilled in the art that various changes in form and details may be made therein without departing from the spirit and scope of the invention as defined by the appended claims.

| [Explanation of reference numerals] | |
| --- | --- |
| 110: unit member | 111: substrate |
| 112: semiconductor layer | 120: thermoelectric element |
| 122: first element unit | 124: connection portion |
| 126: second element unit | 130: thermoelectric element |
| 132: first element unit | 134: connection portion |
| 136: second element unit | 140: first substrate |
| 150: second substrate | 160a, 160b: electrode layer |
| 170a, 170b: dielectric layer | 181, 182: circuit line |
| 200, 300: heat conversion unit | |
| 210, 310: heat conversion unit housing | |
| 220, 320: heat conversion member | |
| 400: dehumidification module | 410: cooling unit |
| 420: drying unit | 430: compressor unit |

The invention claimed is:

1. A dehumidifier comprising:
a dehumidification module comprising a compressor for compressing a refrigerant, a cooler for cooling air by the refrigerant, and a dryer for dehumidifying the air that passes through the cooler; and
a thermoelectric module comprising a first substrate, a second substrate disposed to face the first substrate, a thermoelectric element disposed between the first substrate and the second substrate, a first heat converter connected to the first substrate and disposed adjacent to the dryer of the dehumidification module, and a second heat converter connected to the second substrate and disposed adjacent to the cooler of the dehumidification module,
wherein the first substrate is a heat absorption portion, and the second substrate is a heat dissipation portion,
wherein the first heat converter cools the air passing through the dryer,
wherein the first heat converter comprises a first region in contact with the first substrate and a second region that extends from the first region and is disposed to face the dryer on a flow path of air after passing through the dryer, and wherein the first heat converter comprises a heat conversion member having a flow path pattern formed by folding a third substrate including a first plane and a second plane opposite to the first plane.

2. The dehumidifier of claim 1, wherein the thermoelectric element comprises a P-type thermoelectric element and an N-type thermoelectric element, which are alternately disposed.

3. The dehumidifier of claim 2, wherein the second heat converter dries the air before passing through the cooler.

4. The dehumidifier of claim 2, wherein
the second heat converter comprises a third region adjacent to the second substrate and a fourth region that extends from the third region and is disposed on a flow path of the air before passing through the cooler.

5. The dehumidifier of claim 4, wherein the second heat converter comprises the heat conversion member having a flow path pattern formed by folding of the third substrate.

6. The dehumidifier of claim 5, wherein the flow path pattern has a predetermined pitch and a predetermined height.

7. The dehumidifier of claim 6, wherein a ratio of a pitch of a first heat conversion member included in the first heat converter with respect to a pitch of a second heat conversion member included in the second heat converter is (0.5 to 2.0):1.

8. The dehumidifier of claim 5, comprising a resistive pattern formed on a surface of the third substrate.

9. The dehumidifier of claim 8, wherein the resistive pattern protrudes from at least one of the first plane and the second plane by a predetermined distance.

10. The dehumidifier of claim 9, wherein the resistive pattern protrudes from at least one of the first plane and the second plane by being inclined at a predetermined angle.

11. The dehumidifier of claim 5, comprising a plurality of grooves formed in the third substrate, adjacent grooves of the plurality of grooves being spaced apart by a predetermined distance.

12. The dehumidifier of claim 5, wherein the heat conversion member comprises at least two layers.

13. The dehumidifier of claim 1, comprising an air circulator disposed adjacent to the first heat converter or the second heat converter.

14. A thermoelectric module comprising:
a first substrate;
a second substrate disposed to face the first substrate;
a thermoelectric element disposed between the first substrate and the second substrate;
a first heat converter connected to the first substrate and configured to be disposed adjacent to one surface of a dehumidification module; and
a second heat converter connected to the second substrate and configured to be disposed adjacent to another surface of the dehumidification module;
wherein the first substrate is a heat absorption portion, and the second substrate is a heat dissipation portion, the one surface of the dehumidification module is a surface onto which air is introduced, and the another surface of the dehumidification module is a surface from which air is discharged,
wherein the first heat converter cools air passing through the another surface of the dehumidification module,
wherein the first heat converter comprises a first region in contact with the first substrate and a second region that extends from the first region and is disposed to face the another surface of the dehumidification module on a flow path of air after passing through the another surface of the dehumidification module, and
wherein the first heat converter comprises a heat conversion member having a flow path pattern formed by folding a third substrate including a first plane and a second plane opposite to the first plane.

* * * * *